United States Patent [19]

O'Hara

[11] 4,444,619

[45] Apr. 24, 1984

[54] METHOD OF PRODUCING PRINTED CIRCUITS

[76] Inventor: James B. O'Hara, Angeles, Hammersley Lane, Penn, Buckinghamshire, England, HP10 8HF

[21] Appl. No.: 454,540

[22] Filed: Dec. 30, 1982

[30] Foreign Application Priority Data

Dec. 31, 1981 [GB] United Kingdom ............... 8139141

[51] Int. Cl.$^3$ ........................... C23F 1/02; B44C 1/22; C03C 15/00; C03C 25/06
[52] U.S. Cl. ..................................... 156/645; 29/852; 156/656; 156/659.1; 156/902; 156/904; 174/68.5; 204/15; 204/23; 427/97
[58] Field of Search ............... 156/630, 632, 634, 656, 156/659.1, 645, 901, 902, 904; 174/68.5; 204/15, 23; 427/96, 97, 98; 29/846, 852

[56] References Cited

U.S. PATENT DOCUMENTS 4,075,757 2/1978 Malm et al. .................. 156/902

FOREIGN PATENT DOCUMENTS 1143178 2/1969 United Kingdom .

*Primary Examiner*—William A. Powell
*Attorney, Agent, or Firm*—Bruns & Jenney

[57] ABSTRACT

A method of producing a printed circuit comprising printing a plating resist onto the clean surface of a layer of electrically conductive material on at least one side of a substrate so as to leave exposed only the required track areas of the surface; electroplating over the track areas a metal alloy, preferably a palladium/nickel alloy, which will act as an etch resist for the underlying electrically conductive material, which has good solderability, which has a melting point higher than 250° C., and which will provide a base for gold plate; removing the plating resist; and removing the layer of electrically conductive material from the non-track areas by etching.

11 Claims, No Drawings

METHOD OF PRODUCING PRINTED CIRCUITS

This invention relates to a method of producing printed circuits.

One known method of producing printed circuits comprises starting with a suitable laminate such as a laminated board comprising a non-conductive substrate having on one or both sides thereof an electrically conductive layer, e.g., of copper or other suitable metal or alloy, cleaning the surface or surfaces of said layer or layers, printing a plating resist onto the said surface or surfaces so as to leave only the required track areas exposed, electroplating over the track areas a thickness of about 10 to 15 microns of a tin/lead alloy, e.g., a 60/40 tin/lead alloy, removing the plating resist, removing the electrically conductive layer or layers from the non-track areas in an etching bath, the tin/lead alloy acting as an etch resist during the etching process, conditioning the tin/lead alloy, applying flux over the tin/lead alloy, reflowing the tin/lead alloy covering the track areas to give bright homogeneous tracks suitable for soldering and removing any residues of flux. In addition the printed circuit is drilled to provide required holes therein, drilling being carried out at any convenient stage in the process, e.g., prior to the initial cleaning of the said surface or surfaces. Where the printed circuit is to be provided with gold edge contacts then the printed circuit is masked so as to leave the edge contact area exposed, the tin/lead alloy is removed from the tracks in the edge contact area using either a reverse plating technique or a chemical stripping process, the masking is removed and a fresh masking is applied which leaves exposed the edge contact area and small portions of the tin/lead alloy covered tracks adjacent the edge contact area and gold is plated on to the edge contact area and said small portions of the adjacent tracks to produce gold plated edge contacts which overlap said small portions of the adjacent tracks, the remasking and overlapping of the gold being necessary because of the difficulties in obtaining a good butt joint between the tin/lead alloy and the gold. If the printed circuit is to be double-sided with plated through holes which establish electrical contact between a track area on one side and a track area on the other side, then the inside surfaces of the drilled holes at least the track areas of said electrically conductive layers are cleaned and coated with catalyst, e.g., a palladium/tin catalyst, and a thin layer of copper or other suitable electrically conductive material is then deposited on the inside surfaces of the holes and on the at least said track areas by an electroless plating technique to provide a base on which further electrically conductive material can be built up be an electroplating step to provide a thickness of electrically conductive material sufficient to carry the required electrical current and provide adequate mechanical resistance to thermal shock. If components are to be mounted on the printed circuit using a flow solder technique, e.g., using a wave soldering machine, then a solder mask is printed over those parts of the track area which are not to receive solder. As an alternative to electroplating a tin/lead alloy over the whole of the track area it is known to selectively plate the tin/lead alloy only onto those parts of the track area which are to receive solder, although this involves printing a different etch resist on those parts of the track area not covered by the tin/lead alloy and this leads to registration and other problems.

In another known process the laminate is drilled and cleaned, a catalyst is applied to the inside surfaces of the holes and over the whole of the surface of each electrically conductive layer, electrically conductive material is plated onto the inside surfaces of the holes and over the whole of the surface of each electrically conductive layer by electroless plating; the whole substrate is electroplated with electrically conductive material, an etch resist is applied over the required track areas and so as to "tent" over the plated through holes, the electrically conductive material is removed from the non-track areas in an etching bath, the etch resist is removed, a solder mask is applied which leaves exposed only those parts of the track areas which are to have components soldered thereto, the masked circuit is dipped into a bath of molten tin/lead alloy and the tin/lead alloy is then subjected to a levelling operation.

These known processes of producing printed circuits, and particularly printed circuits with plated through holes and gold plated edge contacts, are relatively complex and involve a large number of different steps, require energy for the removal of the tin/lead alloy from those portions of the tracks in the edge contact area and for the reflowing of the tin/lead alloy, and are relatively expensive. Moreover the printed circuits produced by these known methods are unsatisfactory in that during flow soldering of components to the printed circuit the tin/lead alloy, which has a low melting point of 190° C. tends to run under the solder mask under the heat of the soldering operation (usually about 230° C.) and this mars the appearance of the printed circuit with the components mounted thereon.

The present invention has as its object to provide a method of producing printed circuits, and particularly double-sided printed circuits with plated through holes and with gold edge contacts, which can involve a lesser number of process steps, which can result in a saving in energy and/or in plant and machinery with consequent savings in floor space, which can result in a saving in gold, all or any of which can result in cost savings, and which produces a printed circuit which after components have been assembled thereon using a flow soldering technique produce a more aesthetically pleasing product.

The present invention provides a method of producing a printed circuit, the method comprising the steps of:

(a) printing a plating resist onto the clean surface of a layer of electrically conductive material on at least one side of a substrate so as to leave exposed only the required track areas of the surface, (b) electroplating over the track areas a metal alloy which will act as an etch resist for the underlying electrically conductive material, which has good solderability, which has a melting point higher than 250° C., and which will provide a base for gold plate, (c) removing the plating resist, and (d) removing the layer of electrically conductive material from the non-track areas by etching.

The method preferably further includes the step of applying a solder mask in the conventional manner.

Where the printed circuit is to have gold plated edge contacts then the method may comprise the further step of plating gold directly onto the said metal alloy in the edge contact area of the printed circuit.

If the printed circuit is to be a double-sided printed circuit with plated through holes then the method may further comprise the steps of drilling through the substrate and the layers of electrically conductive material on either side thereof to provide the required number of holes therein, coating the inside surfaces of the holes and the surfaces of the layers of electrically conductive material with a suitable catalyst, e.g., a palladium/tin catalyst, depositing electrically conductive material onto the inside surfaces of the holes and said surfaces of the layers of electrically conductive material using an electroless plating technique, and electroplating the inside surfaces of the holes and the track areas with electrically conductive material, all of these steps except the last being carried out prior to the printing of the plating resist onto the clean surfaces of the electrically conductive layers. As an alternative, part of the electroplating can be carried out prior to the applying of the plating resist and the remainder after applying the plating resist, the plating resist ensuring that the remainder of the electroplate is deposited only on the track areas and the inside surfaces of the holes.

The method of the present invention may be commenced using a substrate having a thickness of electrically conductive material thereon according with the required thickness of the track areas or one may start with a substrate having a lesser thickness of electrically conductive material thereon than that required in the track areas and electroplate electrically conductive material onto the track areas to build-up the required thickness thereon, e.g., when electroplating the inside surfaces of the drilled holes. The substrate may be of an electrically non-conductive material, such as a glass reinforced plastics material or a thermoplastics material, or may be of an electrically conductive material, such as metal, with an electrically non-conductive coating or layer between the substrate and the or each electrically conducting layer. The or each electrically conductive layer may be a metal layer, e.g., of copper or aluminum.

A particularly suitable metal alloy for use in the method of the present invention is a palladium/nickel alloy, e.g., containing from 65% to 95% palladium, such as that disclosed in British Patent Specification No. 1,143,178.

Palladium/nickel alloys have been found to be particularly suitable for use in the method of the present invention because even a thin deposit of as little as 0.125 of a micron will serve as an etch resist for the underlying layer of electrically conductive material in the track areas and because such alloys have good solderability, have a melting point which is much higher than the soldering temperatures used to solder components onto the finished printed circuit, and because such alloys provide a good base for gold plate. Moreover such palladium/nickel alloys have an electrical resistance smaller to that of gold and are therefore particularly suitable for use as a base for gold plate in the edge contact area of a printed circuit with edge contacts. Whilst as little as 0.125 of a micron of a palladium/nickel alloy will be sufficient to serve as an etch resist, it is preferred that the alloy be deposited on the track area to a thickness of at least 0.2 of a micron. Where the printed circuit is to be provided with gold plated edge contacts then the track areas in the edge contact area may have gold plated thereon to a required thickness or may have a greater thickness of palladium/nickel alloy deposited thereon, e.g., to a thickness of 0.5 of a micron, thus enabling the thickness of the gold plate deposited onto the track areas in the edge contact area to be reduced from the usual 5 microns of gold to e.g., from a flash of gold of 0.1 microns or less up to 2 microns, and thus provide a considerable saving in precious metal.

Where a palladium/nickel alloy is used as the etch resist then the electroplating thereof over the track areas is preferably carried out at a current density of from 1 to 1.5 A/dm$^2$ (10 to 15 ASF) and at a temperature of from 20° to 35° C. to ensure that the palladium and nickel are deposited in the correct proportions.

The steps of printing the plating resist onto the surface of the or each layer of electrically conductive material, of removing the plating resist, and of etching to remove the layer of electrically conductive material from the non-track areas are all conventional steps and are all carried out in a manner well-known in the art.

The present invention also provides a printed circuit when made by the method of the present invention.

The method of the present invention will now be more specifically described, by way of example, in relation to the manufacture of a double-sided printed circuit with copper tracks, plated through holes and gold edge contacts. Starting with a commercially available laminated board comprising a substrate of electrically non-conductive material, e.g., fibreglass reinforced epoxide resin, having on each of the opposed faces thereof a layer of copper, the board is drilled to provide required holes therein, cleaned, the whole of the board, including the inside surfaces of the holes, coated with a palladium/tin catalyst by dipping the board in the catalyst, electroless plating the whole of the board including the inside surfaces of the holes with copper by immersing the board in the electroless plating solution, the surfaces of the board overprinted with a dry film or other suitable plating resist so as to leave exposed only the required track areas, and electroplating (pattern plating) the board with copper so as to provide a required thickness of copper in the track areas and on the inside surfaces of the drilled holes, all in conventional manner.

On removal from the pattern plating bath the board is washed with water in a dragout bath, water rinsed, subjected to an anti-tarnish treatment, e.g.m in IMASA CU-56 (Trade Mark) for about 1 to 2 minutes at about 20°–25° C., water rinsed and dried. The exposed copper in the track areas is then cleaned for about 2 minutes in a micro-etch acid cleaner at about 20°–25° C., the board rinsed in water for about 1 minute and in deionised water for about 0.25 minute and the exposed track areas electroplated with a palladium/nickel alloy at a current density of from 1 to 1.5 A/dm$^2$ (10 to 15 ASF) at a temperature of 20° to 35° C., preferably about 25° C. for approximately 40 seconds to provide a thickness of palladium/nickel alloy over the track areas of about 0.2 micron. On removal from the palladium/nickel electroplating bath the board is washed with water in a dragout bath for about 10 seconds and then in a hot water bath for about 1 minute, rinsed in water and dried. The dry film plating resist is then removed by immersing the board in a first bath of alkaline solvent stripper, e.g., Robertsons EP-118 for about 10 minutes at about 60°–70° C., in a second bath of alkaline solvent stripper for about 5 minutes at about 60°–70° C. and passing the board through a hot alkaline solvent stripping brush machine at about 50° C. The board is then etched in conventional manner using an ammoniacal etchant, e.g., MacDermid 9151, at about 45° C. to remove copper from the non-track areas of the board, care being taken to maintain the etchant within its normal operating limits and to avoid over-etching which can result in the edges of the track areas becoming undercut to such an extent that slivers of the palladium/nickel alloy, which acts as an etch resist during etching, can break off and contaminate the printed circuit. After etching the board is rinsed in water, dried and masked for plating of the edge contact area only.

Palladium/nickel alloys provide a good underlay for gold plate and have electrical properties similar to that of gold. Thus the edge contacts can be provided either by simply plating the tracks in the edge contact area with gold to a required thickness or by first plating the tracks in the edge contact area with a palladium/nickel alloy to increase the thickness thereof on the tracks in the edge contact area and then plating with gold, the thickness of gold required in the first case, e.g., about 2 microns, being considerably more than the gold flash or the preferred 0.5 microns required in the second case.

To prepare the tracks in the edge contact area for electroplating either with palladium/nickel alloy or with gold the tracks are given a light chalk clean or hot alkaline clean, rinsed in 10% HCl for 25 seconds to remove chalk residues, rinsed in water, treated with 50% HCl for 1–1.25 minutes to reactivate the nickel in the palladium/nickel alloy previously deposited on the tracks, rinsed in water for 1 minute and rinsed in deionised water for 25 seconds.

If the tracks in the edge contact area are to be first electroplated with palladium/nickel alloy and then with gold the above preparation is carried out both before plating with palladium/nickel alloy and before plating with gold.

Where the tracks in the edge contact area are first plated with palladium/nickel alloy then the electroplating with the palladium/nickel alloy is carried out at a current density of about 1.25 A/dm$^2$ (12.5 ASF) and at a temperature of about 25° C. for a period of time sufficient to build up the required thickness of palladium/nickel alloy on the tracks in the edge contact area. About 50 seconds is required for each 0.25 micron thickness of palladium/nickel deposited.

To gold plate the tracks in the edge contact area the board is live loaded into the electrolyte using a flying lead to ensure good adhesion of the gold to the palladium/nickel alloy on the tracks. Electroplating is carried out at a current density of about 1 A/dm$^2$ (10 ASF) and a temperature of about 35° C. for a period of time (usually about 5 minutes) sufficient to build up the required thickness of gold, e.g., 2 microns, on the tracks in the edge contact area.

It has been found that a thickness of palladium/nickel alloy of about 0.2 micron on the track areas not only acts as an etch resist but also provides a track finish with good solderability. Moreover, such a thickness of palladium/nickel alloy on the tracks in the edge contact area when overlayed with a thickness of about 0.5 micron of gold produces a pore free edge connector ideally suited for many electronic applications where cost is a key factor.

Thereafter the printed circuit board can be used as a conventionally produced printed circuit board, e.g., it can have a solder mask applied thereto and components mounted thereon by a flow soldering technique.

By the use of the method of the present invention the steps of masking the printed circuit, stripping of tin/lead from the edge contact area, removing the masking and applying a new mask, and reflowing the tin/lead alloy, all of which steps are essential in the conventional method when producing a printed circuit with gold plated edge contacts, can be completely avoided with consequent savings in both time and energy. Also, because the gold is plated directly onto the palladium/nickel alloy the difficulties associated with the obtaining of a good joint between the gold and the adjacent tin/lead alloy which are experienced in the known method are avoided. Moreover, palladium/nickel alloys have a bright shiny appearance when electroplated onto the electrically conductive material in the track areas and do not soften and run at normal soldering temperatures so that a completed printed circuit with components soldered thereon is more aesthetically pleasing in appearance than a conventionally produced printed circuit using tin/lead alloy. In addition less gold can be used in the edge contact area of a printed circuit with edge contacts, thus providing savings in precious metal.

By way of comparison and to summarize, the following table shows the different process steps required to produce a double-sided plated through hole printed circuit with copper tracks and gold edge contacts by the said one known method as compared with the method of the present invention:

TABLE

| | Known Method | Method of Present Invention |
|---|---|---|
| (1) | Drill and clean laminate | (1) Drill and clean laminate |
| (2) | Apply catalyst and electroless copper plate to inside surfaces of holes. | (2) Apply catalyst and electroless copper plate to inside surfaces of holes. |
| (3) | Apply plating resist over non-track areas. | (3) Apply plating resist over non-track areas. |
| (4) | Electroplate with copper | (4) Electroplate with copper. |
| (5) | Electroplate tin/lead alloy onto track areas | (5) Electroplate palladium/nickel alloy onto track areas. |
| (6) | Remove plating resist. | (6) Remove plating resist. |
| (7) | Etch to remove copper from non-track areas. | (7) Etch to remove copper from non-track areas. |
| (8) | Mask. | (8) Electroplate edge contact areas with gold over palladium/nickel alloy. |
| (9) | Remove tin/lead alloy from edge contact area. | (9) Apply solder mask. |
| (10) | Remove mask. | |
| (11) | Remask to expose small portion of tin/lead alloy on tracks adjacent to edge contact area. | |
| (12) | Electroplate edge contact area and adjacent track portions with gold. | |
| (13) | Condition the tin/lead alloy. | |
| (14) | Apply flux. | |
| (15) | Reflow tin/lead alloy. | |
| (16) | Remove excess flux. | |
| (17) | Apply solder mask. | |

It will thus be appreciated that although palladium/nickel alloys are more expensive than the tin/lead conventionally used in the production of printed circuits, the method of the present invention enables savings to be made in the number of process steps required, the plant and equipment necessary to carry out those process steps, with consequent savings in floor space, energy, and the amount of gold used, as well as providing a printed circuit which is more aesthetically pleasing in appearance and which is not marred by molten metal running under the soldering mask when components are mounted thereon by a flow soldering technique. Finally, palladium/nickel alloys are very suitable for providing touch-sensitive surfaces, e.g., touch-sensitive switches, when plated onto the track area or areas of a printed circuit.

I claim:

1. A method of producing a printed circuit having an overlayer that allows both solder and gold plate to be directly bonded to the circuit, the method including the steps of placing an electrically conductive layer of material on at least one accessible side of a substrate, printing a plating resist onto the surface of the conductive material to leave exposed track areas on the surface to which electrical components or connectors are to be joined, electroplating over the track areas a palladium/nickel alloy to which both solder and gold plate are directly bondable to provide a high reliability joint for said electrical components or connectors, said alloy having a melting point that is higher than that of the solder, removing the plating resist, and etching away the layer of electrically conductive material from the non-track areas to leave behind a printed circuit that has good solderability and which will provide a base for gold plate.

2. A method according to claim 1, wherein said palladium/nickel alloy contains from 65% to 95% palladium.

3. A method according to claim 1, wherein said alloy is deposited on the track areas to a thickness of at least 0.125 micron.

4. A method according to claim 1, wherein said alloy is deposited on the track areas to a thickness of at least 0.2 micron.

5. A method according to claim 1, wherein said alloy is electroplated onto the track areas at a current density of at least 1 A/dm$^2$ (10 ASF) and at a temperature of from 20°–35° C.

6. A method according to claim 1, which comprises the further steps of drilling holes through the substrate and layers of electrically conductive material on either side thereof, coating at least the inside surfaces of the holes with a catalyst, electroless plating at least the inside surfaces of the holes with electrically conductive material, and electroplating at least the inside surfaces of the holes with electrically conductive material.

7. A method according to claim 1, which comprises electroplating the track areas with electrically conductive material so as to build up a required thickness of electrically conductive material thereon prior to electroplating the track areas with said alloy.

8. A method according to claim 1, which comprises providing the printed circuit with gold plated edge contacts by electroplating gold directly onto the said alloy on the tracks in an edge contact area of the printed circuit.

9. A method according to claim 8, which comprises first electroplating the tracks in the edge contact area with said alloy to increase the thickness thereof before applying the gold.

10. A method according to claim 1, wherein said substrate is of an electrically non-conductive material.

11. A method according to claim 1, wherein said electrically conductive material is copper.

* * * * *